United States Patent [19]

Deckelmann et al.

[11] Patent Number: 4,689,270
[45] Date of Patent: Aug. 25, 1987

[54] COMPOSITE SUBSTRATE FOR PRINTED CIRCUITS AND PRINTED CIRCUIT-SUBSTRATE COMBINATION

[75] Inventors: Karl Deckelmann, Aschaffenburg; Jürgen Hornung, Gründau, both of Fed. Rep. of Germany; Graham S. Jones, Fleet, Great Britain; Roland Kersting, Rodenbach, Fed. Rep. of Germany; Quentin Reynolds, Worplesdon, Great Britain; Ino Taitl, Hasselroth, Fed. Rep. of Germany

[73] Assignee: W. C. Heraeus GmbH, Hanau am Main, Fed. Rep. of Germany

[21] Appl. No.: 755,483

[22] Filed: Jul. 16, 1985

[30] Foreign Application Priority Data

Jul. 20, 1984 [DE] Fed. Rep. of Germany ....... 3426804

[51] Int. Cl.$^4$ .......................... B32B 15/00; B32B 9/00; B22F 3/00; C03C 3/087
[52] U.S. Cl. .................................... 428/432; 428/433; 428/469; 428/471; 428/552; 428/701; 428/901; 501/77
[58] Field of Search ............... 428/433, 432, 469, 471, 428/552, 701, 901; 501/77, 79

[56] References Cited

U.S. PATENT DOCUMENTS

| | | | |
|---|---|---|---|
| 4,256,796 | 3/1981 | Hang et al. | 428/210 |
| 4,309,507 | 1/1982 | Davis et al. | 501/21 |
| 4,315,054 | 2/1982 | Sack et al. | 428/433 |
| 4,385,127 | 5/1983 | Chyung | 501/5 |
| 4,410,598 | 10/1983 | Kuzel et al. | 428/427 |
| 4,517,217 | 5/1985 | Hoffman | 428/632 |

FOREIGN PATENT DOCUMENTS

| | | |
|---|---|---|
| 2558325 | 7/1976 | Fed. Rep. of Germany . |
| 2477525 | 9/1981 | France . |
| 0164592 | 12/1981 | Japan . |
| 0036948 | 3/1983 | Japan . |
| 829447 | 3/1960 | United Kingdom . |

Primary Examiner—John E. Kittle
Assistant Examiner—Patrick J. Ryan
Attorney, Agent, or Firm—Frishauf, Holtz, Goodman & Woodward

[57] ABSTRACT

To permit firing a composite carrier for a printed circuit in which the carrier has a base of metal, typically steel, and thus is highly vibration and bending resistant, the coating or cover layer is a glass ceramic of $BaO$-$Al_2O_3$-$SiO_2$, typically 25 to 40%, preferably 35% of $BaO$, 5 to 20%, preferably 10% $Al_2O_3$ and 40 to 65%, preferably about 55% $SiO_2$. Rather than using 40 to 65% $SiO_2$, a lesser quantity of $SiO_2$, e.g., 30 to 65% may be used and then 0 to 15% $MgO$, 0 to 15% $CaO$, 0 to 5% $SrO$, 0 to 2% $B_2O_3$, 0 to 4% $PbO$, 0 to 3% $ZnO$ and 0 to 4% $TiO_2$ may be applied. The glass ceramic may be dyed, for example by an inorganic dye, such as cobalt silicate, and standard resistor and conductor pastes, such as Cermalloy or Heraprint may be applied and fired at temperatures below 980° C., and entirely suitable for firing temperatures above 850° C. The coating or cover layer has a thickness of above 20 micrometers, preferably of between about 0.03 to 0.06 mm.

12 Claims, No Drawings

COMPOSITE SUBSTRATE FOR PRINTED CIRCUITS AND PRINTED CIRCUIT-SUBSTRATE COMBINATION

The present invention relates to printed circuits and more particularly to a substrate for printed circuits made of a composite material based on metal and silicate.

BACKGROUND

It has previously been proposed to make substrates for printed circuits and to then apply circuit tracks on the substrate, for example by printing, such as screen printing, and then firing the printed material on the substrate. The printed material may be either highly conductive, thus forming a printed conductor, or may be in the form of resistor layers, or dielectric layers. The material is usually applied in the form of a paste, and the substrate may be made of a ceramic, typically aluminum oxide. Enameled steel is also used in some applications.

Substrates made of enameled steel have various advantages over those of ceramic. Enameled steel substrates, up to now, have been used only for special applications. One of the reasons is the low softening temperature of the enamel which limits the firing temperatures of the respective pastes to below about 650° C.

THE INVENTION

It is an object to provide a substrate suitable for use with printed circuits, that is, application of conductor, resistor, and dielectric pastes, which has the advantage of an enameled steel substrate, but which is stable at temperatures above of about 650° C., particularly above 830° C., have a surface layer which is stable, and which is, additionally, compatible with customarily used ceramic substrate pastes, so that the pastes and the surface layer can be fused together by firing.

Briefly, a base layer, typically of steel, is coated with a coating or cover over at least a portion of the base layer, the covering comprising, in accordance with the invention, a silicate which is a $BaO\text{-}Al_2O_3\text{-}SiO_2$ glass ceramic.

A glass ceramic having about 25 to 40% BaO, 5 to 20 $Al_2O_3$, and 40 to 65% $SiO_2$ has been found suitable in practice. Particularly preferred is a glass ceramic having 35% BaO, 10% $Al_2O_3$, and 55% $SiO_2$. All percentages, hereinabove, and unless otherwise indicated in the specification, are percentages by weight.

The thickness of the glass ceramic layer should preferably be not less than 20 micrometers; a thickness of between 30 to 60 micrometers is preferred.

Glass ceramic composite substrates, in which the glass ceramic is located on steel, have the advantage that the glass ceramic is securely connected to the metal and does not peel off upon bending of the substrate. Such glass ceramic/metal combinations are stable with respect to vibration, and are essentially unaffected by shocks and other bending stresses. Substrates made of such composites are, therefore, particularly suitable for use as substrates for printed circuits in automotive electronics, and in other applications where dynamic stresses may be expected.

The substrate or base for the printed circuit may be termed, conventionally, a "metal" substrate. The base layer which forms the metal part of the composite substrate is, usually, a temperature resistant metal or alloy. Particularly suitable is steel, for example sicromal, Invar ® or copper-plated Invar ®.

Substrates in accordance with the present invention have the advantage that they are stable not only up to 830° C., but even higher, for example can be stable up to 980° C., and can be heated repeatedly to temperatures up to 980° C. without deterioration or undesirable changes of characteristics thereof. The substrate materials are particularly suitable for use in circuits in which they are dynamically stressed, for example in automotive electronics, or other applications where resistance against bending, vibration and shock is of particular importance. They are particularly suitable for applications in which previously used aluminum oxide ceramic substrates—which are highly brittle and thus subject to cracking or crazing under vibration or shock—have been found unsuitable.

The substrates have the additional advantage of being entirely compatible with customarily used printed circuit pastes, and thus readily accept existing paste material. The pastes are applied by a suitable process and then fired, The fired conductive tracks or resistance tracks have reproducible conductivity and resistance values. Multi-layer circuit boards can be readily constructed by a well-known processes used, for example, in the technology of such circuit boards from ceramic substrates.

The present invention permits construction of substrates which are only partially coated with glass ceramic. Glass ceramic substrates which are covered only in part, thus, form a particularly suitable embodiment of the invention. They then permit use of the substrate as a support or carrier for a printed circuit and, at the same time, use of the "metal" base layer as a structural element, for example as a housing or part of the housing, or cover of a housing for the circuit which is applied to only a portion of the metal substrate The substrate may also be used as a heater element, particularly when applying printed circuits by thick film technology, so that the electrical conductive circuit element or region will form a resistance heater track.

The glass ceramic does not contain any alkali metals; thus contamination of the electrical conductive or resistance tracks will not occur, and changes in resistance values, or conductivity of the electrical track, with time, will likewise be prevented.

DETAILED DESCRIPTION

The composite substrate is formed, in accordance with the invention, by applying a recrystallizable glass to the base layer to form a coating or cover over at least a portion thereof. The recrystallizable glass is applied in a composition corresponding to the well-known technology in glass ceramics, in powder or paste form, or as a suspension on the metal; the glass ceramic is then fired, in air, at temperatures of up to about 980° C. for bonding with the metal base layer. The powder, paste, or suspension may have a suitable dye, which may be organic or inorganic added thereto. A typical dye or coloring material may, for example, be cobalt silicate or cobalt aluminate.

Powder or pulverized recrystallizable glass can be applied by flame spraying or plasma spraying. The glass may also be applied in paste form. The glass powder or pulverized glass is then mixed with a suitable organic carrier, for example terpineol/ethylcellulose. The resulting pasty mixture is then applied by a suitable method, such as spraying, printing, dipping, brushing-on or pressure-spraying.

A particularly suitable method of application includes application of layers by screen printing which may be repeated if required. This method permits, in a simple manner, to coat either the entire surface of the base, or only selected portions of the surface thereof with the glass ceramic. The composite material can be made, inexpensively, in large sizes The silicate for the metal-silicate composite material may use, generally, a glass ceramic of 25 to 40% BaO, 5 to 20% $Al_2O_3$ 40 to 65% $SiO_2$. Particularly preferred is a glass ceramic having 25 to 50% BaO, 5 to 20% $Al_2O_3$, 30 to 65% $SiO_2$, O to 15% MgO, 0 to 15% CaO, 0 to 5% SrO, 0 to 2% $B_2O_3$, 0 to 4% PbO, 0 to 3% ZnO and 0 to 4% $TiO_2$, for example a glass ceramic having 54.8% $SiO_2$, 34.8% BaO, 9.9% $Al_2O_3$, 0.2% SrO, 0.1% CaO and 0.2% $TiO_2$.

EXAMPLES

Example 1

Preparation of a metal-silicate substrate in accordance with the invention: a sheet of steel of, for example 15 x 10 cm size (about 4 by 6 inches) is surface treated by sand blasting. A suitable steel is steel number 1.4742, which is a highly heart-resistance steel also known as X 10 CrAl 18, having up to about 0.12% carbon, 1 to 1.5% silicon, up to about 1% manganese, about 0.045% phosphorous, about 0.03% sulfur, between 17 and 19% chromium, and from about 0.7 to 1.2% aluminum.

A paste made of 70% powdered glass having a composition of 35.2% BaO, 10.3% $Al_2O_3$ and 54.5% $SiO_2$, is mixed with a binder or carrier, forming 30% of the overall, and, itself, including 92% terpineol and 8% ethylcellulose. The paste is applied by screen printing on the sheet steel, dried for ten minuted at 150° C. in air, and then fired in a continuous furnace for 60 minutes, in which it is exposed for ten minutes to a peak temperature of 950° C.

Example 2

Application of a resistance track, and testing of the resulting resistance: the substrate in accordance with Example 1 above has a silver-paladium paste applied hereto. Such a silver-palladium paste is known also as Cermalloy-EMD C 4140, having a silver-to-palladium ratio of about 26:1. The paste is applied by screen printing, dried, and then fired on the composite substrate for 60 minutes in a continuous furnace at a maximum temperature of 850° C., the maximum temperature exposure having a duration of about 10 minutes. Thereafter, a well-known Ruthenium-oxide resistance paste, known as Heraprint R 4020B is applied, again by screen printing, and, after drying, similarly fired in a continuous furnace as the Cermalloy-EMD C 4140 layer. Both the Cermalloy-EMD C 4140, forming a conductor layer and the Heraprint R 4020B, forming a resistor layer, are standard in the technology and have been used as conductor pastes and resistor pastes, respectively, on aluminum oxide ceramic substrates, customary in the prior art.

The sheet resistance is determined in the standard manner and will be 95 ohms per square.

Comparative Example

An aluminum oxide plate of 5×5×0.06 cm has the silver-palladium conductive paste—Cermalloy-EMD C 4140 and the Ruthenium-oxide resistance paste (Heraprint R 4020B) applied by screen printing and fired under conditions similar to those of the preceding example with the composite metal substrate. The sheet resistance determined in a manner identical to that above is 100 ohms per square.

A suitable determination of sheet resistance may be done in accordance with standard sheet resistance determinations, for example as described in the standard DIN 41850 of January 1976.

The two pastes, Cermalloy-EMD C 4140 and Heraprint R 4020B were applied in layers of about 12 micrometers and about 15 micrometers, respectively, overlapping each other.

We claim:

1. High temperature resistant composite layer printed circuit substrate having
   a steel base and a glass-ceramic coating or cover layer over at least a portion of the steel base consisting essentially of
   25 to 40% BaO
   20% $Al_2O_3$
   40 to 65% $SiO_2$.

2. Substrate according to claim 1, wherein the coating or cover layer consists essentially of 35% BaO, 10% $Al_2O_3$ and 55% $SiO_2$.

3. Substrate according to claim 1, further comprising an inorganic dye or color material within the coating or cover layer.

4. Substrate according to claim 1, wherein the coating or lower layer is applied over only a portion of the base.

5. Substrate according to claim 1, further comprising an inorganic dye or color material containing cobalt within the coating or cover layer.

6. Substrate according to claim 1, further comprising an inorganic dye or color material containing cobalt silicate within the coating or cover layer.

7. A printed circuit comprising
   a composite substrate having a steel base and a glass-ceramic coating or cover layer over at least a portion of the base consisting essentially of
   25 to 40% BaO
   5 to 20% $Al_2O_3$
   40 to 65% $SiO_2$,
   all percentages by weight,
   and a thick film printed circuit formed on the coating or cover layer and fired thereonto.

8. The printed circuit of claim 7, wherein said glass ceramic coating or cover layer consists essentially of
   35% BaO
   10% $Al_2O_3$
   55% $SiO_2$.

9. The printed circuit of claim 2, further including an inorganic dye or coloring material within said coating or cover layer.

10. The printed circuit of claim 9, wherein said inorganic dye or coloring material comprises cobalt.

11. The printed circuit of claim 7, wherein said thick film printed circuit includes thick film resistance material fired on the coating.

12. The printed circuit of claim 7, wherein the coating or cover layer is applied over only a portion of the of the base.

* * * * *

UNITED STATES PATENT AND TRADEMARK OFFICE
CERTIFICATE OF CORRECTION

PATENT NO. : 4,689,270

DATED : August 25, 1987

INVENTOR(S) : DECKELMANN et al

It is certified that error appears in the above-identified patent and that said Letters Patent is hereby corrected as shown below:

Column 4, line 26 (Claim 1):

Change "20% $Al_2O_3$" to --5 to 20% $Al_2O_3$--.

Signed and Sealed this

Seventh Day of April, 1992

Attest:

HARRY F. MANBECK, JR.

*Attesting Officer*      *Commissioner of Patents and Trademarks*